United States Patent
Sarraf

(10) Patent No.: US 7,561,416 B1
(45) Date of Patent: Jul. 14, 2009

(54) STORAGE DEVICE FIXTURE WITH SIMULTANEOUS UNLOAD MECHANISM

(75) Inventor: Mohammad Sarraf, Trabuco Canyon, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 290 days.

(21) Appl. No.: 11/639,853

(22) Filed: Dec. 15, 2006

(51) Int. Cl.
*H05K 5/00* (2006.01)
*H05K 7/00* (2006.01)

(52) U.S. Cl. .................. 361/679.32; 361/679.33; 361/679.37; 361/679.38; 361/679.39

(58) Field of Classification Search .................. 361/685, 361/686, 679.32–33, 679.37–39; 439/157, 439/159, 160
See application file for complete search history.

(56) References Cited

U.S. PATENT DOCUMENTS

| | | | | |
|---|---|---|---|---|
| 5,197,894 A | * | 3/1993 | Koike | .......................... 439/159 |
| 5,264,974 A | | 11/1993 | Campbell et al. | |
| 5,299,089 A | * | 3/1994 | Lwee | .......................... 361/684 |
| 5,863,212 A | * | 1/1999 | Duesterhoeft | ............... 439/160 |
| 6,204,992 B1 | | 3/2001 | Rockwell | |
| RE37,265 E | * | 7/2001 | Lwee | .......................... 439/157 |
| 6,498,771 B1 | | 12/2002 | Boyce et al. | |
| 6,552,868 B1 | | 4/2003 | Suzuki | |
| 6,781,789 B2 | | 8/2004 | Ostwald | |
| 6,956,714 B2 | | 10/2005 | Oohara et al. | |
| 6,991,480 B2 | * | 1/2006 | Katayanagi et al. | .......... 439/159 |
| 2003/0112549 A1 | | 6/2003 | Hoelsaeter et al. | |
| 2004/0174688 A1 | | 9/2004 | Lin et al. | |
| 2005/0105209 A1 | | 5/2005 | Hoelsaeter | |
| 2005/0254164 A1 | | 11/2005 | Cox et al. | |

* cited by examiner

*Primary Examiner*—Jayprakash N Gandhi
*Assistant Examiner*—Anthony M Haughton
(74) *Attorney, Agent, or Firm*—Seed IP Law Group PLLC

(57) ABSTRACT

A storage device fixture includes first and second storage device bays for receiving first and second storage devices, the first and second storage device bays having first and second entrances, respectively. First and second ejector assemblies are at least partially linearly moveable within the first and second storage device bays, respectively, and first and second rotatable linkages also form part of the storage device fixture, the first rotatable linkage rotatable in a first rotational direction in engagement with the first ejector assembly, and the second rotatable linkage rotatable in a second rotational direction in engagement with the second ejector assembly. Finally, an actuator may move in engagement with at least one of the first and second rotatable linkages, causing the first and second rotatable linkages to rotate substantially simultaneously in the first and second rotational directions, respectively.

18 Claims, 5 Drawing Sheets

STORAGE DEVICE FIXTURE WITH SIMULTANEOUS UNLOAD MECHANISM

BACKGROUND

1. Field of the Invention

This invention relates to an unloading mechanism for a storage device fixture.

2. Description of the Related Art

During the production and testing of storage devices (e.g., hard disk drives, flash drives, etc.), the devices must often be transferred among and between pieces of equipment (such as the equipment pictured in FIG. 1) representing a number of different manufacturing and testing stages. Typically, the storage devices are transferred between the pieces of equipment manually, although in some facilities such transfer has been automated.

Since storage devices moving throughout a manufacturing facility are often similarly configured, the storage devices may need to be removed from a piece of equipment at the same or nearly the same time. Thus, for example, if a plurality of hard disk drives must undergo a comprehensive testing process prior to shipment, the plurality of drives loaded into a testing module at approximately the same time will typically complete the testing process at approximately the same time. Indeed, in many pieces of testing/manufacturing equipment, such as that shown in FIG. 1, a very large number of drives may be simultaneously tested.

Conventional storage device bays into which storage devices are inserted, however, provide individual ejection mechanisms for each device. Thus, in order to eject the plurality of disk drives, for example, a plurality of ejection mechanisms must be actuated by a technician. This duplicative effort on the part of the technician or operator (or robot, if the unloading process is automated) may slow down the manufacturing process and may lead to reduced throughput.

Accordingly, there is a need in the art for a means of more efficiently ejecting storage devices from storage device bays.

DETAILED DESCRIPTION

Figure 2:
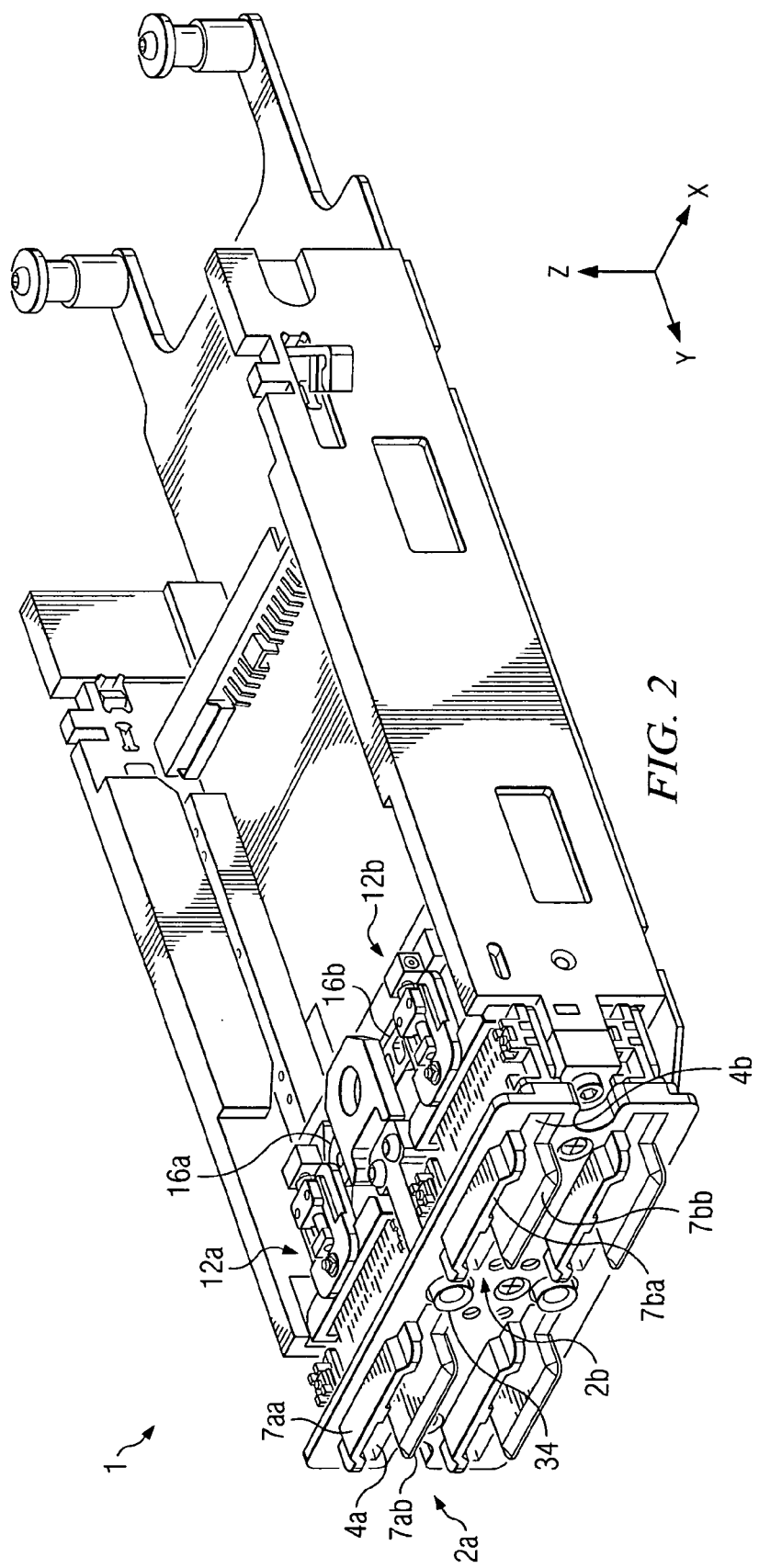
FIG. 2 is a perspective view of a storage device fixture constructed according to one embodiment of the present invention.

Referring to FIG. 2, a storage device fixture 1 is illustrated according to one embodiment of the present invention. As illustrated, the storage device fixture 1 includes first and second storage device bays 2a, 2b for receiving first and second storage devices (not shown). The first and second storage device bays 2a, 2b each comprise first and second entrances 4a, 4b, respectively. The storage device fixture 1 further comprises first and second ejector assemblies 12a, 12b at least partially linearly moveable within the first and second storage device bays 2a, 2b, respectively, and the storage device fixture 1 further comprises first and second rotatable linkages 16a, 16b (only partially visible in FIG. 2), the first rotatable linkage 16a rotatable in a first rotational direction in engagement with the first ejector assembly 12a, and the second rotatable linkage 16b rotatable in a second rotational direction in engagement with the second ejector assembly 12b. The storage device fixture 1 further comprises an actuator 34 moveable in engagement with at least one of the first and second rotatable linkages 16a, 16b, causing the first and second rotatable linkages 16a, 16b to rotate substantially simultaneously in the first and second rotational directions, respectively.

As illustrated, the storage device fixture 1 in FIG. 2 has four storage device bays, with a matching set of device bays below the first and second storage device bays 2a, 2b. Of course, in other embodiments, the storage device fixture 1 may only contain two storage device bays, or may include more than four storage device bays.

Figure 1:
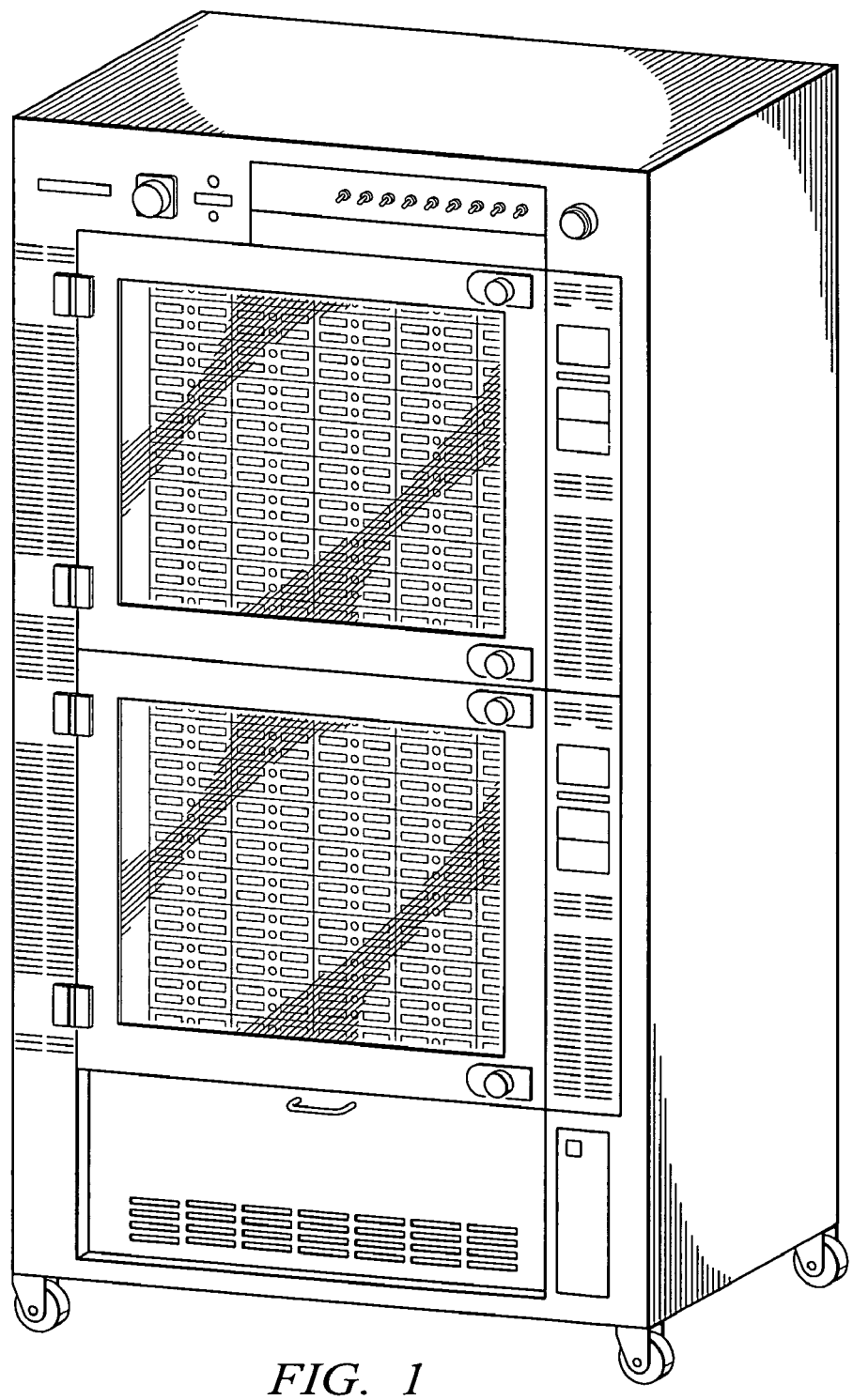
FIG. 1 shows a piece of testing equipment for storage devices within which a storage device fixture constructed according to one embodiment of the present invention may be incorporated.

The storage device fixture 1 shown in FIG. 2 may be used in a variety of contexts, including manufacturing/testing environments, or in consumer products. In a preferred embodiment, it might be incorporated into a piece of equipment such as that shown in FIG. 1, such that a plurality of storage device fixtures 1 may accept and eject storage devices in accordance with the present invention. The storage device fixtures 1 may also be constructed as shown in FIG. 2, such that they can be inserted into an existing piece of manufacturing or testing equipment.

Figure 3:
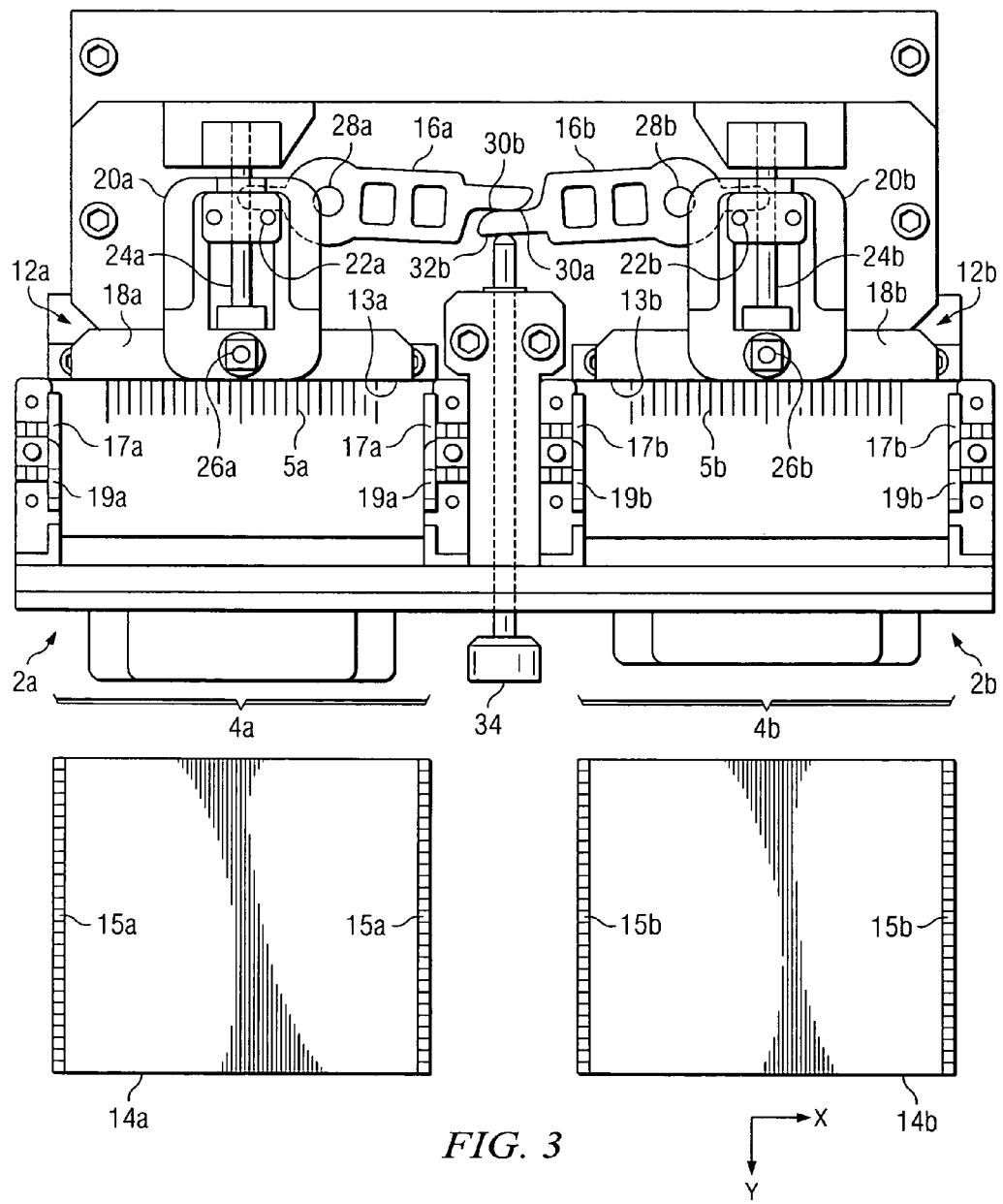
FIG. 3 is a top-down plan view of a portion of the storage device fixture of FIG. 2 about to receive two storage devices.

FIG. 3, a top-down plan view of a portion of the storage device fixture 1 of FIG. 2, illustrates in greater detail an apparatus in accordance with one embodiment of the present invention. As shown in FIGS. 2-5, an x-axis, y-axis and z-axis have been defined so that the orientation of various components of the storage device fixture 1 may be discussed more easily. Such axes do not indicate any relationship between the storage device fixture 1 and any other structures. In addition, in the following description, the term "distal y-axis direction" or "distal" refers to a direction along the y-axis towards the back of the storage device bays (i.e., towards the top of FIGS. 3-5), while the term "proximal y-axis direction" or "proximal" refers to a direction along the y-axis towards the front of the storage device bays (i.e., towards the bottom of FIGS. 3-5).

As shown in FIG. 3, the storage device fixture 1 includes first and second storage device bays 2a, 2b. In the illustrated embodiment, these storage device bays 2a, 2b include interface connectors 5a, 5b for coupling the storage device fixture 1 to the inserted storage devices 14a, 14b. In other embodiments, the storage device fixture 1 may simply retain the storage devices 14a, 14b (e.g., for transportation or storage), and in such an embodiment, the storage device bays 2a, 2b may not include interface connectors. In still other embodiments, the interface connectors 5a, 5b may be separate from the storage device fixture 1 and may instead form part of the equipment or apparatus within which the storage device fixture 1 resides.

The storage device bays 2a, 2b are also generally sized and configured to securely hold the storage devices 14a, 14b. In the illustrated embodiment (as may be more easily seen in FIG. 2), the storage device bays 2a, 2b include first and second entrances 4a, 4b that define the proximal boundary of the storage device bays and interface connectors 5a, 5b that define the distal boundary of the storage device bays. In this embodiment, these features of the storage device bays 2a, 2b guide the storage devices 14a, 14b into the bays and retain them securely within. For example, in one embodiment, the coupling between the interface connectors 5a, 5b and the inserted storage devices 14a, 14b securely holds the storage devices 14a, 14b within the storage device bays 2a, 2b. Thus, it may be understood that a storage device bay need not completely enclose an inserted storage device. Rather, as would be well understood by one of skill in the art, a storage device bay is merely configured to receive a storage device at least partially within the space defined by the bay.

In one embodiment, the storage device bays 2a, 2b may comprise additional features to securely retain the storage devices 14a, 14b. For example, as illustrated in FIG. 3, the storage devices 14a, 14b may include side tabs 15a, 15b. These tabs may, in one embodiment, be thinner along the z-axis than the rest of the storage device and may extend to both sides of the storage device along the x-axis. The storage device bays 2a, 2b may comprise corresponding slots 17a, 17b (respectively) configured to at least partially receive the side tabs 15a, 15b. In one embodiment, this slot-tab configuration assists with the registration and insertion of the storage devices 14a, 14b into the storage device fixture 1. For example, the storage devices 14a, 14b may comply with the Compact Flash II specification, whereby one of the corresponding slots 17a, 17b is wider than the other, and the side tab corresponding to that slot is also wider than the other side tab. Thus, the storage devices 14a, 14b may only be inserted one way, preventing mis-registration between the storage devices 14a, 14b and the interface connectors 5a, 5b. Other asymmetric slot configurations or other features may be used in other embodiments to facilitate registration, and the correct insertion of the storage devices.

The storage device bays 2a, 2b may further comprise spring clips 19a, 19b adjacent the slots 17a, 17b. As illustrated, these spring clips 19a, 19b extend partially into the slots 17a, 17b. Upon insertion of the storage devices 14a, 14b, these spring clips 19a, 19b are deflected in the z-axis (out of the page in FIG. 3) by the side tabs 15a, 15b and exert a spring force against these side tabs 15a, 15b, pressing these side tabs along the z-axis against the opposing surface of the slots 17a, 17b (into the page in FIG. 3). Thus, the storage devices 14a, 14b may, in one embodiment, be more securely held within the storage device fixture 1. Other registration features may also be used in other embodiments.

The first and second storage devices 14a, 14b illustrated in FIG. 3 are hard disk drives. In particular, as illustrated, the first and second storage devices 14a, 14b are disk drives having a 1" form factor. These hard disk drives, in one embodiment, have an industry standard interface that may engage and connect with the interface connectors 5a, 5b located within the storage device bays 2a, 2b. In one embodiment, this interface may be a Parallel Advanced Technology Attachment (PATA) interface, a Serial Advanced Technology Attachment (SATA) interface, a Universal Serial Bus (USB) interface, or any other suitable interface. Of course, other storage devices are possible in other embodiments of the present invention. For example, hard disk drives of different form factors, flash drives, memory card media, PCMCIA cards and tapes are some examples of other storage drives that may be ejected by mechanisms constructed in accordance with the present invention, such as that shown in FIG. 3.

As illustrated, the entrances 4a, 4b are those portions of the bays 2a, 2b through which the storage devices 14a, 14b are inserted and ejected. In the embodiment of FIG. 2, the entrances 4a, 4b to the first and second storage device bays 2a, 2b may be flanked by guide flanges 7aa, 7ab and 7ba, 7bb respectively. As illustrated, it may be seen that the flanges 7aa, 7ab may facilitate insertion of a storage device 14a into the storage device bay 2a, by, for example, helping to guide the storage device 14a into mating engagement with the interface connector 5a. In addition, such guide flanges 7aa, 7ab may serve a protective function by preventing an operator using the storage device fixture 1 from grasping the storage device 14a along the z-axis in order to remove the storage device 14a from the fixture. Instead, the operator's fingers are guided to the outside edges of the flanges 7aa, 7ab when the storage device is ejected, and the operator will grasp the storage device 14a along the x-axis. For example, in one embodiment, when ejected, the storage device 14a will not extend more than a half-inch past the outside edges of the flanges 7aa, 7ab, thereby encouraging the operator to grasp the storage device 14a along the x-axis.

In one embodiment, the entrances 4a, 4b are sized and configured to relatively snugly allow the insertion of storage devices 14a, 14b in order to ensure a proper connection with the interface connectors 5a, 5b. As illustrated in FIG. 3, in one embodiment, the interface connectors 5a, 5b may have a plurality of pins and little room for slop, and therefore the entrances 4a, 4b should be constructed at a fairly tight tolerance. Of course, in other embodiments, other configurations for the entrances 4a, 4b are possible.

In one embodiment, the storage device fixture 1 further comprises first and second ejector assemblies 12a, 12b at least partially linearly moveable within the first and second storage device bays 2a, 2b, respectively (along the y-axis). In one embodiment, the first ejector assembly 12a includes a surface 13a that extends at least partially within the first storage device bay 2a in at least some positions. This surface 13a may be moved in engagement with and/or into contact with the first storage device 14a, when the first storage device 14a is inserted into the first storage device bay 2a. In a preferred embodiment, the second ejector assembly 12b is similarly configured.

In one embodiment, the first and second ejector assemblies 12a, 12b comprise first and second ejector plates 18a, 18b, at least a portion of the first and second ejector plates 18a, 18b being moveable within the first and second storage device bays 2a, 2b. In one embodiment, the surfaces 13a, 13b are defined by the first and second ejector plates 18a, 18b, respectively. In one embodiment, the ejector plates 18a, 18b comprise bent pieces of metal extending near the interface connectors 5a, 5b, which contact the storage devices 14a, 14b when the storage devices are inserted. As illustrated, the ejector plates 18a, 18b extend proximally along the y-axis, and then bend to extend downward along the z-axis (i.e., into the page) to partially surround the interface connectors 5a, 5b. These downwardly extending portions of the ejector plates 18a, 18b, in one embodiment, define the surfaces 13a, 13b.

In the illustrated embodiment, the first and second ejector assemblies 12a, 12b further comprise first and second slide plates 20a, 20b coupled to the first and second ejector plates 18a, 18b respectively. The first and second slide plates 20a, 20b are preferably manufactured from plastic. Along the y-axis, the slide plates 20a, 20b are preferably each configured to include a guidehole or slot (not shown). These guideholes may be sized and configured to receive first and second slide rods 24a, 24b, respectively. In one embodiment, the slide rods 24a, 24b are fixed relative to the storage device fixture 1, while the first and second slide plates 20a, 20b slide along them, allowing linear movement of at least a portion of the first and second ejector assemblies 12a, 12b. In a preferred embodiment, the slide rods 24a, 24b comprise a metal, such as stainless steel.

Of course, in other embodiments, other means for enabling linear movement may be used. For example, in one embodiment, the first and second slide plates 20a, 20b may include different structures for sliding along the slide rods 24a, 24b. In another embodiment, the ejector assemblies may comprise piston-like structures, such that a generally rotational movement of distal portions of the ejector assemblies causes the ejector plates to move substantially linearly. In many alternative embodiments, the ejector assemblies 12a, 12b need not be slideable, and portions of the ejector assemblies 12a, 12b may move rotationally or in a curvate manner. However, the movement of the ejector assemblies may be considered partially linear, as long as a portion of each ejector assembly is moving substantially linearly.

In one embodiment, the first and second slide plates 20a, 20b are further coupled to first and second tabs 22a, 22b, respectively. As illustrated, these tabs 22a, 22b extend downward along the z-axis (i.e., into the page). As illustrated, the first and second rotatable linkages 16a, 16b may engage the first and second ejector assemblies 12a, 12b via these tabs 22a, 22b. The tabs 22a, 22b, in one embodiment, may be constructed from metal (in a preferred embodiment, stainless steel). As illustrated, the tab 22a is a circular shaft coupled with the first slide plate 20a. In one embodiment, the tab 22b is similarly configured. Of course, in other embodiments, the tabs 22a, 22b may be omitted, and the first and second rotatable linkages 16a, 16b may, for example, engage the first and second slide plates 20a, 20b directly or may engage directly some other structure.

In a preferred embodiment, the first and second ejector assemblies 12a, 12b further comprise first and second plate pivots 26a, 26b, respectively, about which the first and second ejector plates 18a, 18b may pivot. Preferably, the first and second slide plates 20a, 20b are coupled to the first and second ejector plates 18a, 18b via the first and second plate pivots 26a, 26b respectively. The plate pivots 26a, 26b are also preferably configured to enable only limited rotation by the first and second ejector plates 18a, 18b within the x-y plane. The rotation of the ejector plates 18a, 18b may enable relatively even ejection forces to be applied to the first and second storage devices 14a, 14b during the ejection process in accordance with embodiments of the present invention. In one embodiment, the plate pivots 26a, 26b enable approximately 0-10° of rotation, although differing degrees of freedom may be enabled in other embodiments. Any suitable pivots may be used to perform this function, and in a preferred embodiment, the pivots are constructed from a metal, such as stainless steel.

In one embodiment, the first rotatable linkage 16a is coupled to the storage device fixture 1 about a first pivot 28a, defining a first pivot point (i.e., the mathematical point about which the first rotatable linkage 16a rotates). The first rotatable linkage 16a may be configured to rotate about the first pivot point in the x-y plane in both counterclockwise and clockwise rotational directions (as viewed from above in the z-axis). In a preferred embodiment, when the first rotatable linkage 16a is rotated about the first pivot 28a in the counterclockwise direction, the first rotatable linkage 16a may exert a force against the first tab 22a (such that the first rotatable linkage 16a moves in engagement with the first ejector assembly 12a), which may move at least a portion of the first ejector assembly 12a linearly in the proximal y-axis direction (i.e., towards the first entrance 4a), in order to eject a first inserted storage device 14a. In one embodiment, the second rotatable linkage 16b is similarly configured to rotate about a second pivot 28b. Preferably, the second rotatable linkage 16b may be rotated about the second pivot 28b in the clockwise direction in order to exert a force against the second tab 22b (such that the second rotatable linkage 16b moves in engagement with the second ejector assembly 12b), which may move at least a portion of the second ejector assembly 12b linearly in the proximal y-axis direction (i.e., towards the second entrance 4b), in order to eject the second inserted storage device 14b. This process will be explained in further detail below with respect to FIGS. 4 and 5.

The pivots 28a, 28b may be any suitable pivots. In one embodiment, they may simply be stainless steel cylinders about which the rotatable linkages 16a, 16b (having corresponding holes to receive the cylinders) freely rotate. In another embodiment, the pivots 28a, 28b and rotatable linkages 16a, 16b may have a ball bearing configuration. As illustrated, the pivots 28a, 28b generally define substantially parallel axes about which the first and second rotatable linkages 16a, 16b may rotate.

In the illustrated embodiment, the rotatable linkages 16a, 16b comprise curvate surfaces 30a, 30b that face one another. These curvate surfaces 30a, 30b facilitate the rotation of the rotatable linkages 16a, 16b in engagement with one another. In one embodiment, the surfaces 30a, 30b are curved such that at most points along the range of rotation of the rotatable linkages 16a, 16b, the rotatable linkages 16a, 16b contact at only one point (which constantly changes throughout the range of rotation) along these curvate surfaces. In a preferred embodiment, the rotatable linkages 16a, 16b may be constructed identically and coupled in opposite orientations to the storage device fixture 1. The curvate surfaces 30a, 30b may also reduce contamination and wear between the rotatable linkages 16a, 16b.

In the illustrated embodiment, the second rotatable linkage 16b further comprises a generally flat surface 32b, which (when in an inserted configuration) faces generally in the proximal y-axis direction and in the direction of the actuator 34. In one embodiment, this surface 32b is the only surface that interfaces between the rotatable linkages 16a, 16b and the actuator 34. In such an embodiment, a distal end of the actuator 34 may contact the second rotatable linkage 16b at the generally flat surface 32b, may engage that surface 32b, and may thereby rotate the second rotatable linkage 16b and the first rotatable linkage 16a substantially simultaneously (as the second rotatable linkage 16b engages the first rotatable linkage 16a at the interface of their respective curved surfaces 30a, 30b).

Of course, in other embodiments, the configuration of the actuator and rotatable linkages may be different. For example, in one embodiment, the actuator may simultaneously directly contact and engage both rotatable linkages, thereby moving them simultaneously. In such an embodiment, the rotatable linkages need not engage one another, and may instead have curved surfaces, displaced along the z-axis, that face the distal end of the actuator. Thus, in such an embodiment, the rotatable linkages need not lie in the same x-y plane. In other embodiments, the rotatable linkages may be coupled together more permanently such that one rotatable linkage is incapable of moving independently of the other. In still other embodiments, the rotatable linkages may both rotate in the same direction in order to eject the storage devices (e.g., in one embodiment, the actuator may be offset along the x-axis, and one of the rotatable linkages may have much greater mechanical advantage than the other).

Although in one embodiment the rotatable linkages comprise plastic materials, in other embodiments, any suitable material may be chosen.

In one embodiment, the actuator 34 is moveable in engagement with at least one of the first and second rotatable linkages 16a, 16b causing the first and second rotatable linkages 16a, 16b to rotate substantially simultaneously in the counterclockwise and clockwise rotational directions respectively.

As illustrated, the actuator 34 may comprise a cylindrical bar mounted within the storage device fixture 1. In one embodiment, the actuator 34 is received within and is slideable within a guide (not shown) through the storage device fixture 1. The actuator 34 may be moved along the y-axis in order to contact at least one of the first and second rotatable linkages 16a, 16b.

In other embodiments, the actuator 34 may be configured differently. In one embodiment, the actuator 34 may be coupled to the first rotatable linkage 16a, which may in turn be coupled to the second rotatable linkage 16b. In such an embodiment, the actuator 34 may be located distally from the storage device bays 2a, 2b and "pulled" in the distal y-axis direction in order to move the rotatable linkages 16a, 16b in the counterclockwise and clockwise rotational directions, respectively. As illustrated, the actuator 34 is moved substantially linearly along the y-axis, as it slides within the storage device fixture 1. However, in other embodiments, portions of the actuator may move, for example, in a pendulum-like or circular fashion to engage and move the rotatable linkages.

As illustrated, the actuator 34 preferably has a wider proximal end that facilitates an operator (human or robot) depressing the actuator 34 in the distal y-axis direction. In another embodiment, the actuator 34 may be actuated by other mechanical, electrical or electromechanical means (for example, by a solenoid).

Moreover, in the embodiment described herein, the actuator 34 facilitates the ejection of two storage devices 14a, 14b that are horizontally adjacent. In other embodiments, the two storage devices 14a, 14b may be vertically aligned, and ejected in accordance with the present invention. In still other embodiments, four storage device bays may be arranged as is shown in FIG. 2, and a single actuator may be used to activate both sets of device bays at the substantially simultaneously, thereby ejecting four storage devices substantially simultaneously. Of course, other embodiments are also possible, in which a single actuator may eject a large plurality of drives.

Figure 4:
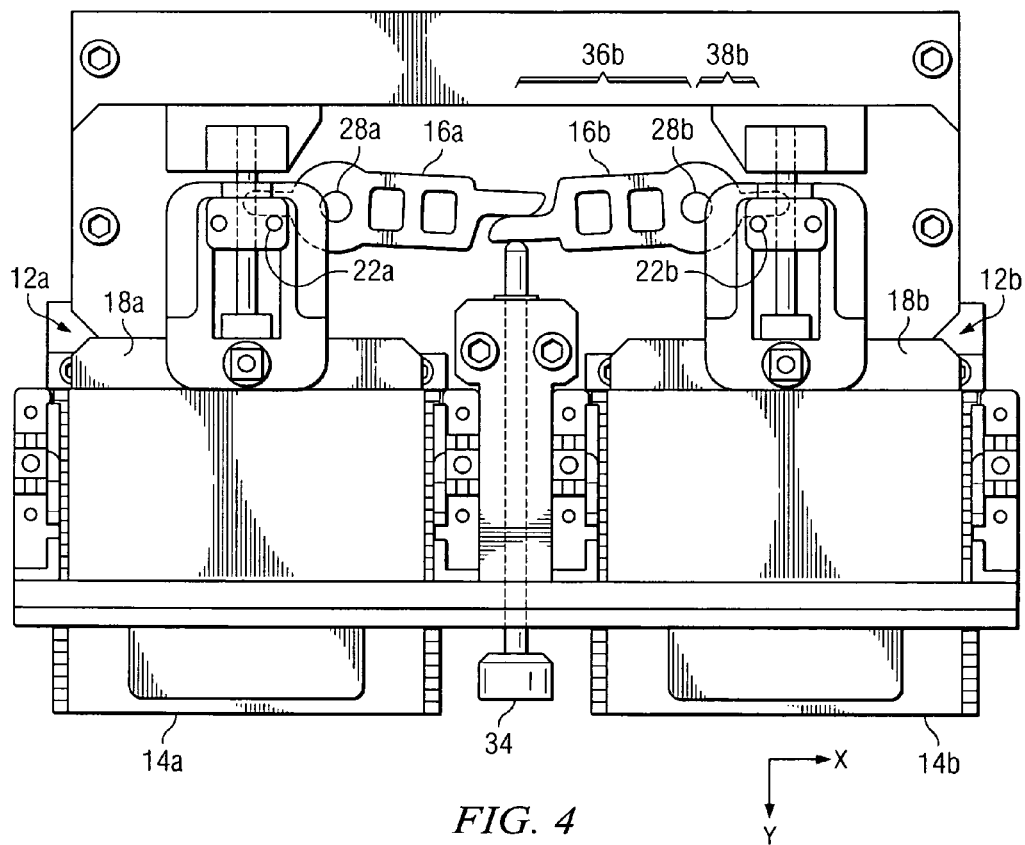
FIG. 4 is a top-down plan view of a portion of the storage device fixture of FIG. 2 with the two storage devices in an inserted position.
Figure 5:
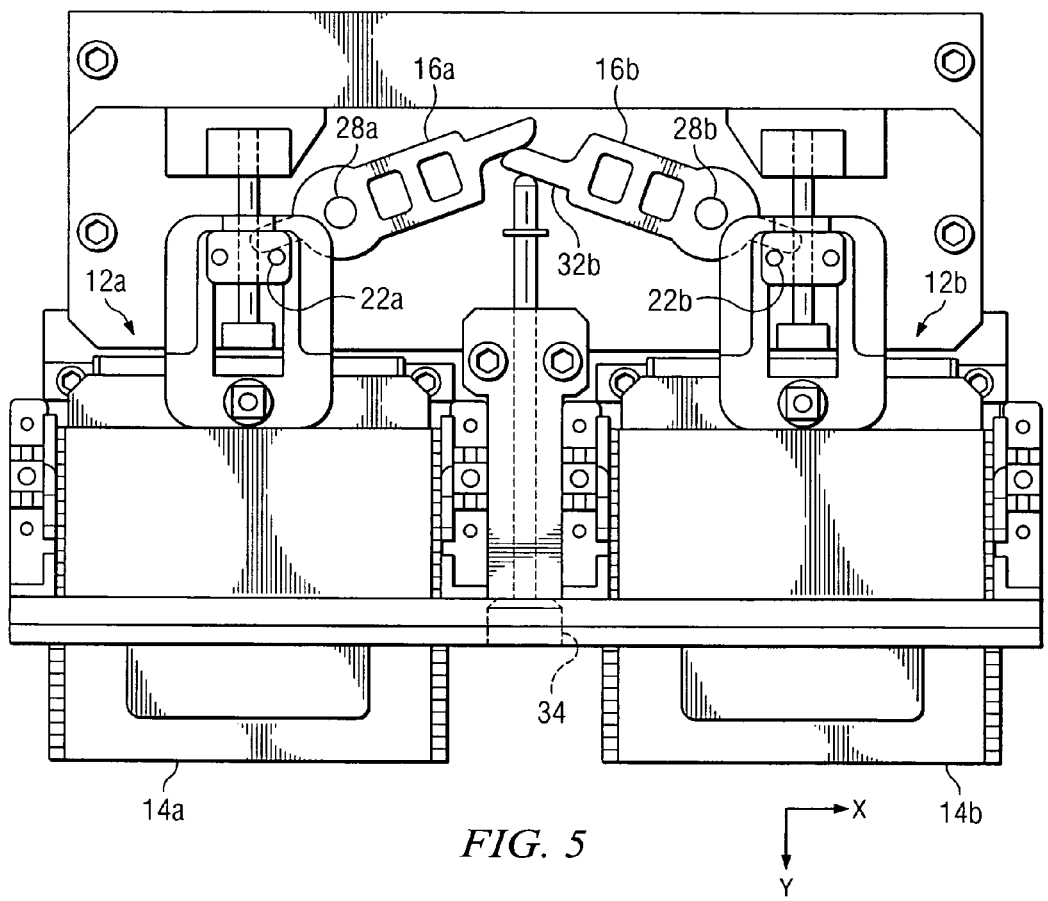
FIG. 5 is a top-down plan view of a portion of the storage device fixture of FIG. 2 with the two storage devices in an ejected position.

With reference to FIGS. 4 and 5, one method of using the illustrated storage device fixture will be described in further detail. In FIG. 4, a portion of the storage device fixture 1 of FIG. 2 is shown with the two storage devices 14a, 14b illustrated in inserted positions. As shown, when the storage devices 14a, 14b are inserted or loaded within the storage device fixture 1, the storage devices 14a, 14b engage the interface connectors 5a, 5b (not visible in FIG. 4), and the first and second ejector assemblies 12a, 12b may be moved in the distal y-axis direction. In one embodiment, the storage devices 14a, 14b, as they are being inserted into the storage device fixture 1, contact the surfaces 13a, 13b of the ejector plates 18a, 18b, and thereby move at least a portion of the first and second ejector assemblies 12a, 12b distally as the storage devices 14a, 14b begin to engage the interface connectors 5a, 5b.

In turn, the ejector assemblies 12a, 12b, as they are moved in the distal y-axis direction, may engage and rotate the rotatable linkages 16a, 16b respectively via the tabs 22a, 22b. Thus, the first rotatable linkage 16a may be pivoted in the clockwise direction (as shown in the top-down view of FIG. 4), and the second rotatable linkage 16b may be pivoted in the counterclockwise direction. Note that, in the illustrated embodiment, if the second storage device 14b is inserted first, then the second rotatable linkage 16b may be moved to the position illustrated in FIG. 4, while the first rotatable linkage 16a (and the first ejector assembly 12a) remain in the ejected position illustrated in FIG. 5. On the other hand, according to this embodiment, note that if the first storage device 14a is inserted first, then the second rotatable linkage 16b may be engaged by the first rotatable linkage 16a, and thereby the storage device fixture 1 may be placed in the same configuration illustrated in FIG. 4 (except that no second storage device 14b has yet been inserted).

Finally, in turn, as the first and second rotatable linkages 16a, 16b are engaged and moved by the first and second ejector assemblies 12a, 12b, the second rotatable linkage 16b also engages the actuator 34 and moves it in the proximal y-axis direction until reaching a proximal actuator position. At this point, the storage devices 14a, 14b may be ejected by actuation of the actuator 34, and, for example, in a testing or manufacturing environment, a battery of tests may now be run on the storage devices 14a, 14b, as they are coupled via the interface connectors 5a, 5b.

In FIG. 5, a portion of the storage device fixture 1 of FIG. 2 is illustrated with the two storage devices in ejected positions. In order to eject the storage devices 14a, 14b from their inserted positions illustrated in FIG. 4, the actuator 34 may be depressed (i.e., moved in the distal y-axis direction). In one embodiment, a human operator may perform this function, while in other embodiments, a robot or machine may actuate the actuator 34. In the illustrated embodiment, as the actuator 34 moves in the distal y-axis direction, it engages the flat surface 32b of the second rotatable linkage 16b, and the second rotatable linkage 16b is rotated about the second pivot 28b in a clockwise direction. As the second rotatable linkage 16b pivots in the clockwise direction, it engages the first rotatable linkage 16a (along their respective curvate surfaces) and causes the first rotatable linkage 16a to rotate in a counterclockwise direction.

In one embodiment, as both rotatable linkages 16a, 16b rotate substantially simultaneously in the two respective directions, they respectively engage the first and second ejector assemblies 12a, 12b via the tabs 22a, 22b. As the first and second rotatable linkages 16a, 16b rotate, they cause at least a portion of the first and second ejector assemblies 12a, 12b to move towards the first and second entrances 4a, 4b, respectively. Portions of both first and second ejector assemblies 12a, 12b may thereby move generally linearly in the proximal y-axis direction. The surfaces 13a, 13b of these ejector assemblies 12a, 12b may thus engage the storage devices 14a, 14b and eject them from the storage device bays 2a, 2b. In general, a storage device may be considered ejected so long as it has been moved in the direction of the entrance/exit of the storage device bay.

In a preferred embodiment, the ejector assemblies 12a, 12b have a limited range of motion such that they stop moving in the proximal y-axis direction once the surfaces 13a, 13b are slightly past the interface connectors 5a, 5b. In this embodiment, the storage devices 14a, 14b may be easily extracted from the storage device fixture 1, as they are no longer coupled with the interface connectors 5a, 5b, but they are not pushed far past the interface connectors 5a, 5b (in which case they might fly uncontrolled out from the storage device bays). As another measure to prevent the storage devices 14a, 14b from uncontrollably flying from the storage device bays, one embodiment of the present invention includes spring clips 19a, 19b. These spring clips 19a, 19b preferably function as brakes, such that once the storage devices 14a, 14b have been ejected past the interface connectors 5a, 5b, their proximal motion is still impeded by the force of the spring clips 19a, 19b. Different variations of this ejection process may be chosen depending on the environment and intended use of the storage device fixture.

Returning to FIG. 4, in one embodiment, when in the inserted position, the actuator 34 contacts and engages the second rotatable linkage 16b at approximately a first distance 36b from the second pivot point (at the center of the second pivot 28*b*). In this inserted position, the second rotatable linkage 16*b* also contacts and engages the second ejector assembly 12*b* (at the tab 22*b*) at approximately a second distance 38*b* from the second pivot point. As may be seen from this Figure, the first distance is preferably greater than the second distance. Thus, by designing the actuator 34 to contact the second rotatable linkage 16*b* at a first distance 36*b* from the second pivot point which is greater than the second distance 38*b* between the second pivot point and the ejector assembly engagement, the storage device fixture 1 may give the operator or robot a mechanical advantage.

In a preferred embodiment, the first distance is approximately three times the second distance, in order to give a 3 to 1 mechanical advantage. In another embodiment, the first distance is greater than three times the second distance, in order to give an even greater mechanical advantage. Such a configuration may be used when the coupling forces between the interface connectors 5*a*, 5*b* and the storage devices 14*a*, 14*b* are particularly great. In a preferred embodiment, as illustrated, the first and second rotatable linkages 16*a*, 16*b* give substantially the same mechanical advantage.

In one embodiment, a method of unloading storage devices from the storage device fixture 1 may comprise loading the first storage device 14*a* into the first storage device bay 2*a*, and loading the second storage device 14*b* into the second storage device bay 2*b*. In a preferred embodiment, this loading step may take place as described above with respect to FIG. 4. Other methods of loading the storage devices may also of course be used in accordance with other embodiments of the present invention.

In one embodiment, once the storage devices 14*a*, 14*b* are loaded, a first force may be applied to the actuator 34 in order to substantially simultaneously eject the first and second storage devices 14*a*, 14*b*. As described above, an operator, robot or some other means may be used to apply the first force to the actuator 34. As illustrated, the actuator 34 may be moved in the distal y-axis direction, although other embodiments are also possible. Using the storage device fixture 1 described at length above, due to the mechanical couplings and engagements, the first and second storage devices 14*a*, 14*b* may then be ejected substantially simultaneously. It is to be understood that substantially simultaneous ejection is accomplished as long as the actuator 34 completes one movement in order to eject both storage devices 14*a*, 14*b*.

As described above, with reference to FIG. 5, preferably the first force applied to the actuator 34 is less than a second force applied to at least one of the first and second storage devices 14*a*, 14*b* during ejection. In one embodiment, this difference in force is created by the mechanical advantage of using the rotatable linkages 16*a*, 16*b* as levers. In a preferred embodiment, the forces applied to both the first and second storage devices 14*a*, 14*b* are approximately the same, and are each at least three times greater than the first force. In one embodiment, such a ratio is attained by constructing the storage device fixture 1 such that the first distance 36*b* is at least three times greater than the second distance 38*b*.

In one embodiment, the materials that comprise the storage device fixture 1 may be chosen to reduce friction as much as possible. For example, in one embodiment, many of the surfaces that interface with one another comprise dissimilar materials. In such an embodiment, the first ejector plate 18*a* may comprise stainless steel and may be coupled to the first slide plate 20*a* made from a plastic, which slides along the first slide rod 24*a* made from stainless steel. The first tab 22*a* extending from the first slide plate 20*a* may be made from stainless steel, which contacts the first rotatable linkage 16*a* made from plastic. The first rotatable linkage 16*a* and the second rotatable linkage 16*b* may both be made from plastic and may be contacted by the actuator, which is preferably made from stainless steel. In general, many of the surfaces that may interact and cause friction are preferably made from metallic and non-metallic materials respectively. Different materials may also, of course, be used in other embodiments of the present invention, and in one embodiment, the above configuration may simply be "reversed" (i.e., plastic materials substituted for stainless steel, and vice versa). In a preferred embodiment, the non-metallic materials are made from a hard plastic material, such as ABS or polycarbonate.

What is claimed is:

1. A storage device fixture comprising:

first and second storage device bays for receiving first and second storage devices, the first and second storage device bays having first and second entrances, respectively;

first and second ejector assemblies at least partially linearly moveable within the first and second storage device bays, respectively;

first and second rotatable linkages, the first rotatable linkage rotatable in a first rotational direction in engagement with the first ejector assembly, and the second rotatable linkage rotatable in a second rotational direction in engagement with the second ejector assembly; and an actuator moveable in engagement with at least one of the first and second rotatable linkages, causing the first and second rotatable linkages to rotate substantially simultaneously in the first and second rotational directions, respectively;

wherein the actuator engages the second rotatable linkage, and the second rotatable linkage is rotatable in the second rotational direction in engagement with the first rotatable linkage causing the first rotatable linkage to rotate in the first rotational direction.

2. The storage device fixture of claim 1, wherein rotation of the first rotatable linkage in the first rotational direction causes at least a portion of the first ejector assembly to move towards the first entrance, and rotation of the second rotatable linkage in the second rotational direction causes at least a portion of the second ejector assembly to move towards the second entrance.

3. The storage device fixture of claim 1, wherein the first and second ejector assemblies comprise first and second ejector plates, the first and second ejector plates moveable within the first and second storage device bays.

4. The storage device fixture of claim 3, wherein the first and second ejector assemblies further comprise first and second slide plates coupled to the first and second ejector plates respectively.

5. The storage device fixture of claim 4, wherein the first and second slide plates are coupled to first and second tabs respectively, via which the first and second rotatable linkages engage the first and second ejector assemblies.

6. The storage device fixture of claim 4, wherein the first and second slide plates slide along first and second slide rods.

7. The storage device fixture of claim 5, wherein the first and second ejector assemblies further comprise first and second plate pivots respectively about which the first and second ejector plates pivot.

8. The storage device fixture of claim 7, wherein the first and second slide plates are coupled to the first and second plate pivots respectively.

9. The storage device fixture of claim 7, wherein the first and second plate pivots enable limited rotation by the first and second ejector plates.

10. The storage device fixture of claim 1, wherein the first and second rotatable linkages include first and second curvate surfaces respectively facing one another, and the second rotatable linkage further includes a flat surface facing the actuator.

11. The storage device fixture of claim 1, wherein the first and second rotational directions are about parallel axes in opposite directions.

12. The storage device fixture of claim 1, wherein the actuator is metallic, and the rotatable linkages are non-metallic.

13. The storage device fixture of claim 1, wherein the second rotatable linkage rotates about a second pivot point, the actuator engages the second rotatable linkage at a first distance from the second pivot point, and the second rotatable linkage engages the second ejector assembly at a second distance from the second pivot point, wherein the first distance is greater than the second distance.

14. The storage device fixture of claim 13, wherein the first distance is at least three times greater than the second distance.

15. The storage device fixture of claim 1, wherein the first and second entrances each further comprise top and bottom flanges extending outward from the first and second entrances respectively.

16. The storage device fixture of claim 15, wherein, in an ejected position, the first and second storage devices do not extend beyond the top and bottom flanges more than a half-inch, respectively.

17. A method of unloading storage devices from a storage device fixture, the storage device fixture comprising first and second storage device bays and an actuator, the method comprising:
   loading a first storage device into the first storage device bay;
   loading a second storage device into the second storage device bay; and
   applying a first force to the actuator in order to substantially simultaneously eject the first and second storage devices, wherein applying the first force to the actuator includes:
      moving first and second ejector assemblies in contact with the first and second storage devices respectively; and
      rotating first and second rotatable linkages to apply forces against the first and second ejector assemblies respectively, the actuator contacting the second rotatable linkage which in turn contacts the first rotatable linkage;
   wherein the first force is less than a second force applied to at least one of the first and second storage devices during ejection.

18. The method of claim 17, wherein the first force is at least three times less than the second force.

\* \* \* \* \*